United States Patent [19]
Chu

[11] Patent Number: 5,444,445
[45] Date of Patent: Aug. 22, 1995

[54] MASTER + EXCEPTION LIST METHOD AND APPARATUS FOR EFFICIENT COMPRESSION OF DATA HAVING REDUNDANT CHARACTERISTICS

[75] Inventor: Ke-Chiang Chu, Saratoga, Calif.

[73] Assignee: Apple Computer, Inc., Cupertino, Calif.

[21] Appl. No.: 62,973

[22] Filed: May 13, 1993

[51] Int. Cl.$^6$ ............................................. H03M 7/30
[52] U.S. Cl. .......................................... 341/87; 341/63
[58] Field of Search ..................... 341/50, 51, 55, 63, 341/64, 76, 87

[56] References Cited

U.S. PATENT DOCUMENTS

| | | | |
|---|---|---|---|
| 3,612,660 | 10/1971 | Miller | 341/87 |
| 4,420,771 | 12/1983 | Pirsch | 341/76 |
| 4,682,150 | 7/1987 | Mathes et al. | 341/50 |

OTHER PUBLICATIONS

Storer, Data Compression Methods and Theory, 1988, Computer Science Press, pp. 40–45.

*Primary Examiner*—Howard L. Williams
*Attorney, Agent, or Firm*—V. Randall Gard

[57] ABSTRACT

A method and apparatus for compressing inherently redundant data. A Unicode file is comprised of prefix group indicator bytes and suffix character indicator bytes and can therefore be separated into two files, one containing the prefixes and one containing the suffix characters. Then, each separate file can be separately compressed using means best suited to the characteristics of each. Because of the high degree of redundancy across the prefix group indicator bytes they can be more greatly compressed which in turn results in greater compression of the entire Unicode file. Multiple compression methodologies, equally applicable to any inherently redundant data file, can be applied to the prefix group indicator bytes to yield the best compression results. In the present invention, one commonly occurring byte, known as the master byte, is chosen and each exception to the master byte in the data file to be compressed is noted by location (l) and value (v) thus reducing the overall size of the data file. Further, sequences of repeated bytes are replaced by an indicator (r) of the number of repeated bytes within a given sequence rather than duplicating each separate instance of a repeated byte.

7 Claims, 6 Drawing Sheets

MASTER + EXCEPTION LIST METHOD AND APPARATUS FOR EFFICIENT COMPRESSION OF DATA HAVING REDUNDANT CHARACTERISTICS

FIELD OF THE INVENTION

The present invention relates generally to the field of data compression, and more particularly to compression of data having inherently redundant characteristics.

BACKGROUND OF THE INVENTION

In the field of data processing, an 8 bit byte is the traditional unit of computer data. Typically, individual characters in a file or data set are separately denoted and stored as single bytes. Commonly known and used single-byte character formats include American standard code for information interchange (ASCII) and extended binary coded decimal interchange code (EBCDIC).

There are however, problems or difficulties which have arisen due to limitations of the 8 bit byte character format. First of all, with only 8 bits per character, there can be only 256 (2 to the 8th power) different characters represented. While 256 characters is generally sufficient for languages such as English, it is generally insufficient for other languages such as Kanji or Chinese. Secondly, 8 bits (256 characters) is generally insufficient to represent a combined language environment, such as English characters intermixed with math symbols and/or control characters.

Furthermore, software vendors have been forced to make 'localized software' when distributing software in multiple countries because 256 characters is generally insufficient to support all of the different characters needed for all of the different languages of those countries. Completion, maintenance and support of localized software can be a tremendous undertaking. Thus, the typical single byte character formats are inadequate in an increasingly complex global computing environment.

For these reasons, a new character format or standard has emerged known as Unicode. As is well known and is explained in "The Unicode Standard, Worldwide Character Encoding" Version 1.0, Volume One, Copyright 1990, 1991 Unicode, Inc., Unicode is a fixed-width, uniform text and character encoding scheme utilizing a 16-bit architecture which extends the benefits of ASCII to multilingual text. Unicode characters are consistently 16 bits wide, regardless of language, so no escape sequence or control code is generally required to specify any character in any language. Unicode character encoding treats symbols, alphabetic characters, and ideographic characters identically, so that they can be used simultaneously and with equal facility.

Because there are 16 bits per character, it is possible to represent up to 65,536 (2 to the 16th power) different characters with Unicode. The Unicode standard currently contains over 28,000 characters, including 2,300 general (alphabetic or syllabic) letters, 1,200 textual symbols, and 3,300 CJK (Chinese/Japanese/Korean) phonetics, punctuation, symbols, Korean Hangul syllables and over 20,000 Han characters.

The Unicode format, as stated above, utilizes 16 bits for each character represented. Referring now to FIG. 1, the format of a single generic Unicode character of 16 bits is Shown. The first half (first 8 bits), or prefix, of each character represented in Unicode is an indicator of the group (e.g., math symbol, Kanji, English, etc.) of the particular character being represented. The second half (second 8 bits), or suffix, of each character represented in Unicode indicates which particular character within the indicated group is being represented.

Unicode can therefore more easily represent a variety of characters in a single document or file without requiring specialized or localized software. However, the storage overhead of Unicode data is, by definition, larger than with 8-bit character formats because Unicode data uses 16 bits per character. Thus, documents or data files stored in the Unicode format are generally twice as large as would be the same documents or data files represented in ASCII, for example. There is therefore a need to reduce the increased size of Unicode files while still retaining the ability to represent the range of characters supported by the Unicode character format.

Typical compression methodologies handle uncompressed data on a byte-by-byte basis. Compressing data on a byte-by-byte basis generally works well for data which is comprised of characters stored in a single-byte-per-character format. Referring now to FIG. 7, an example compression method which is well known in the art processes an uncompressed input data stream 10 to generate a compressed data output stream 20 by comparing an uncompressed portion 13 of input data stream 10 to data in a history buffer 11 of already processed input data. If a matching data string 12 is located in history buffer 11 for current data string 14, data string 14 is encoded in compressed data stream 20 as a pointer ($p_o, l_o$) 24, corresponding to an offset $p_o$ 15 and a data length $l_o$ 16. The shorter length data of pointer ($p_o, l_o$) 24 thus replaces longer data string 14 in output compressed data stream 20.

Unfortunately, such prior art compression approaches do not work as well with Unicode data because each character in the Unicode format is comprised of two bytes. One problem is the greater time needed to compress Unicode data. This is because Unicode data comprises suffix character data interspersed with prefix group indicators and hence, in general, more bytes have to be scanned in order to find each match.

Another problem is the general doubling of the value of the resulting length (l) and offset (p) values to what is the equivalent matching character as would have occurred in a non-Unicode data format. Doubling the value of either the length (l) or the offset (p) values results in a decreased compression ratio, an undesirable side effect.

A still further problem is the increased difficulty in finding matching strings when the current data string to be matched occurs at a break between a prefix group indicator and its associated suffix character due to the previous matching-string. In that situation, one is no longer merely trying to match a character and its associated prefix group code with an earlier character and its associated prefix group code. Instead one is trying to match a character and a following prefix group code with an earlier occurrence of the same character and the same following prefix group code. There is less likelihood of finding such a match and so this too results in a decreased compression ratio.

Thus, an improved compression methodology is needed to handle the larger data files of the two-byte-per-character Unicode format.

SUMMARY AND OBJECTS OF THE INVENTION

An objective of the present invention is to provide an improved method and apparatus for efficient compression of data.

Another objective of the present invention is to provide an improved method and apparatus for efficient compression of data having redundant characteristics.

A still further objective of the present invention is to provide an improved method and apparatus for efficient compression of data stored in a Unicode character format.

The foregoing and other advantages are provided by a method for compressing a data file comprising choosing one byte of the data file as a master byte and noting each exception to the master byte which occurs in the data file.

The foregoing and other advantages are also provided by a method for converting a data file to a compressed data file comprising scanning a predetermined number of bytes of the data file, selecting the byte with the highest number of occurrences within the predetermined number of bytes of the data file as a master byte, noting the value (v) of the master byte in the compressed data file, scanning each byte of the data file and noting each exception to the master byte which occurs in the data file by noting in the compressed data file the location (l) and the value (v) within the data file of the exception to the master byte.

The foregoing and other advantages are also provided by an apparatus for compressing a data file comprising a processor means for choosing one byte of the data file as a master byte by scanning a predetermined number of bytes of the data file and selecting the byte with the highest number of occurrences within the predetermined number of bytes of the data file, a processor means for noting each exception to the master byte in the data file by location (l) within the data file and by the value (v) of the exception, and a memory means for storing the compressed data file.

Other objects, features and advantages of the present invention will be apparent from the accompanying drawings and from the detailed description which follows.

BRIEF DESCRIPTION OF THE DRAWINGS

The present invention is illustrated by way of example and not limitation in the figures of the accompanying drawings, in which like references indicate similar elements, and in which.

DETAILED DESCRIPTION OF THE INVENTION

Figure 2:
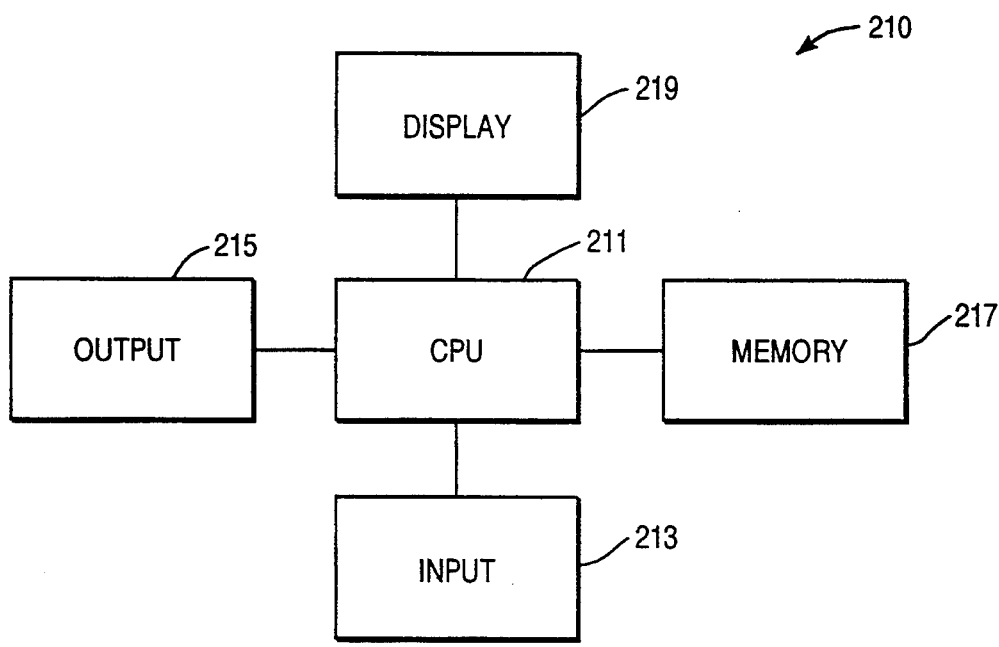
FIG. 2 is a generalized block diagram of a typical computer system which might utilize the present invention.

FIG. 2 is a generalized block diagram of a typical computer system 210 which might utilize the present invention. Computer system 210 includes a CPU/memory unit 211 that generally comprises a microprocessor, related logic circuitry, and memory circuitry. Input device 213 provides input to the CPU/memory unit 211, which by way of example can be a keyboard, a mouse, a trackball, a joystick, a stylus, a touch screen, a touch tablet, etc., or any combination thereof. External storage 217, which can include fixed disk drives, floppy disk drives, memory cards, etc., is used for mass storage of programs and data. Display output is provided by display 219, which by way of example can be a video display or a liquid crystal display. Note that for some configurations of computer system 210, input device 213 and display 219 may be one and the same, e.g., display 219 may also be a tablet which can be pressed or written on for input purposes.

As has been explained, the Unicode standard stores data in a two-byte-per-character format. And because traditional compression methods do not properly handle data stored in multiple-bytes-per-character, the increased file size of Unicode data competes with the benefits of using the Unicode format. The present invention overcomes the limitations of the traditional compression methods while still supporting the benefits gained through use of the Unicode standard.

Figure 1:
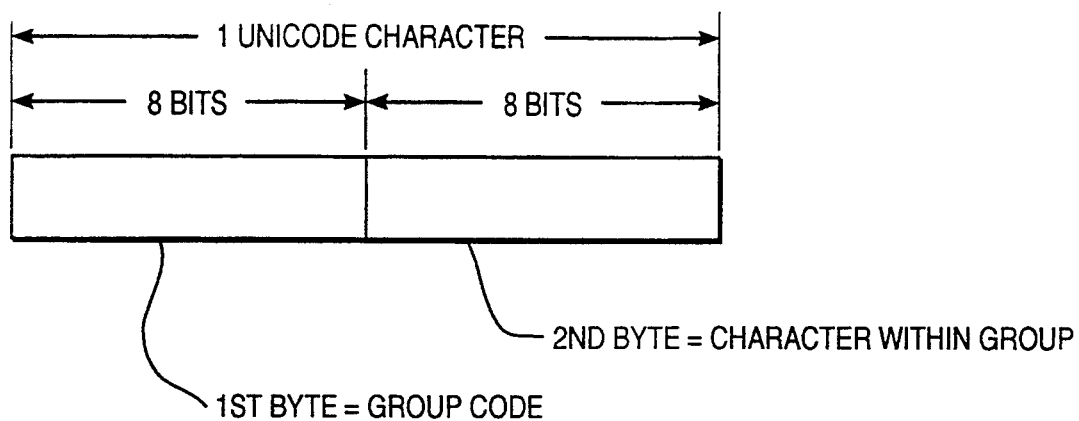
FIG. 1 depicts the format of a single generic Unicode character.
Figure 3:
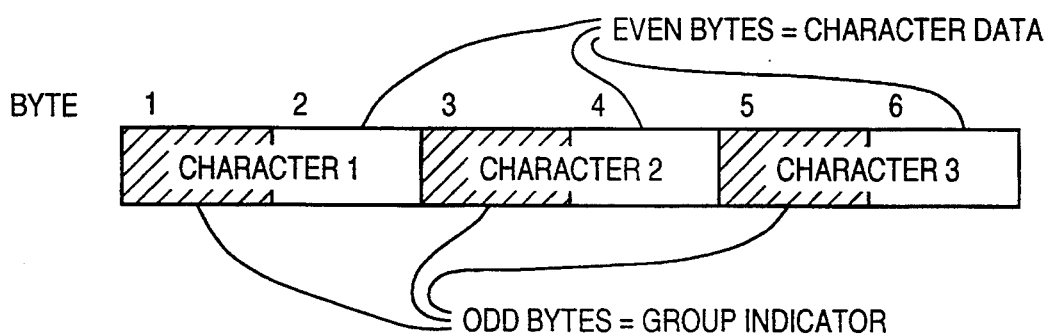
FIG. 3 depicts a typical sequence of characters stored in the two-byte-per-character Unicode format.

Referring now to FIG. 3, a typical sequence of two-byte characters stored in a Unicode format can be seen. Bytes 1, 3 and 5 of the character sequence are the prefix group indicator bytes while bytes 2, 4 and 6 are the suffix characters themselves (see discussion with reference to FIG. 1).

It is important to note here that while the prefix group indicator bytes 1, 3 and 5 of FIG. 3 could be different from each other, because most documents tend to primarily use one language there tends to be a high degree of redundancy in the group indicator bytes within a single document or file stored in the Unicode format. In other words, because a single document tends to be written primarily in a single language (e.g., English, Japanese, etc.) with a fewer number of other types of characters (e.g., control, mathematic symbols, etc.) intermixed, there tends to be a high degree of redundancy across the group indicator bytes within a file. This inherent redundancy of Unicode data (where generally every other byte is a group indicator byte) can be greatly utilized to improve compression of such data, as will be explained more fully herein.

Figure 4:
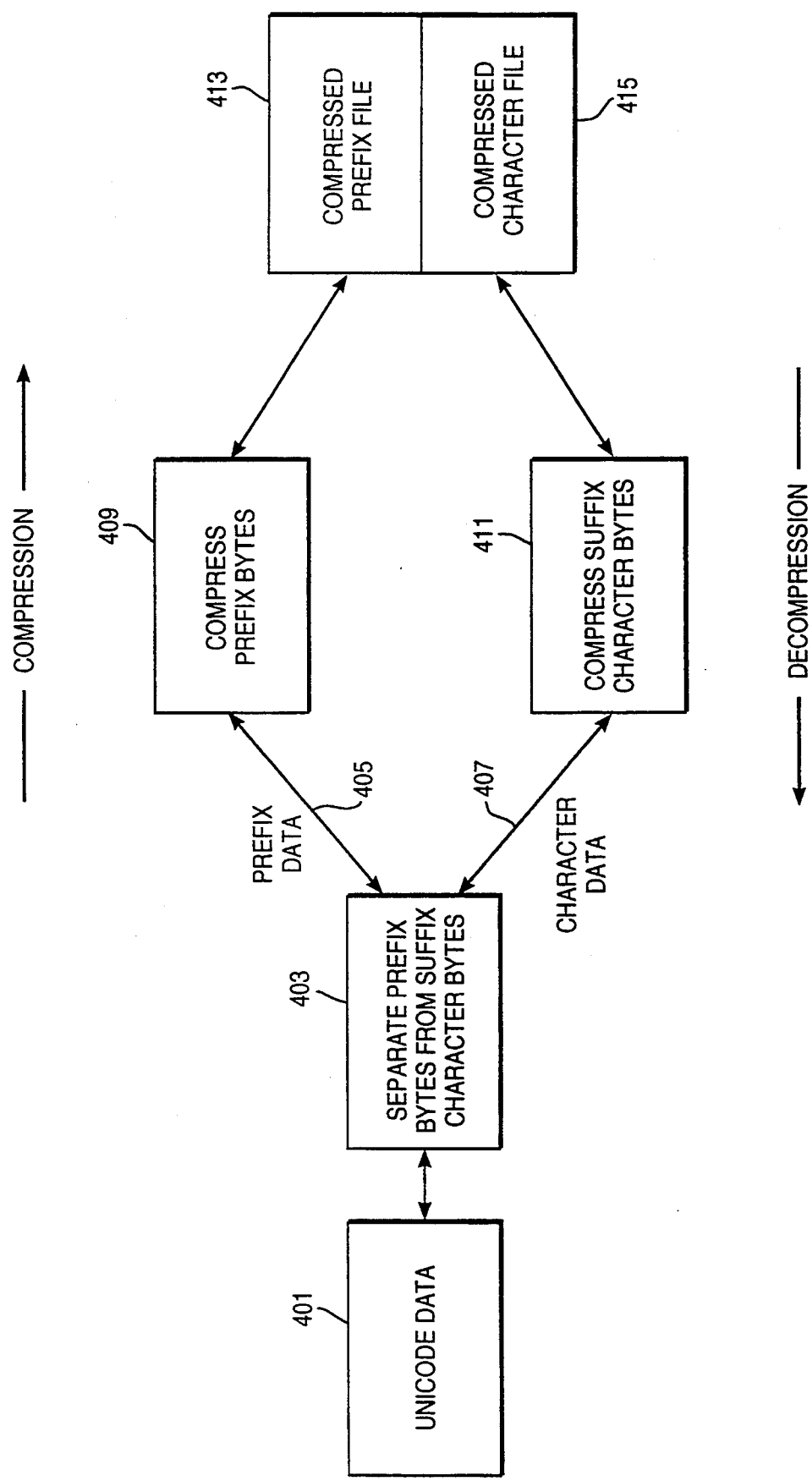
FIG. 4 is a block diagram of the compression and decompression approach of the present invention.

Referring to FIG. 4, the compression methodology of the preferred embodiment of the present invention will now be explained. Uncompressed Unicode data 401 is first separated into two blocks or files, one block or file containing the inherently redundant prefix group indicator bytes 405 without the suffix character indicating bytes and one block or file containing the suffix character indicating bytes 407 without the prefix group indicator bytes. This is a simple process in the preferred embodiment since these are merely alternating bytes within the incoming uncompressed Unicode data.

The file containing the suffix character bytes 407 can be compressed 411 using any typical data compression method and results in compressed character file or block 415.

In the preferred embodiment of the present invention, the file containing the inherently redundant prefix group indicator bytes 405 is compressed using one of a number of compression methodologies and results in compressed prefix file or block 413.

Note that compressed prefix file 413 and compressed character file 415 are stored as a single combined compressed Unicode file in the preferred embodiment of the present invention.

Note that decompression is provided by merely reversing the compression process, as is indicated in FIG. 4.

One approach 409 to compressing the prefix group indicator bytes 405 is to use a methodology known as run-length encoding. Run-length encoding, as is well known in the art and is explained in "Text Compression" by T. C. Bell, J. G. Cleary, and I. H. Witten, copyright 1990 by Prentice-Hall, Inc., pp. 20,22, replaces sequences of repeated characters with a count of the number of spaces or instances of that character being repeated. For example, an input sequence 405 comprising (ZZZZYYYYZZZZZZXXXXZZZZ) after compression 409 becomes file 413 comprising ((4,Z),(5,Y),(6,Z),(4,X),(5,Z)) using the format ((count, character),(count, character)(count, character)...).

Another approach 409 to compressing the group indicator bytes 405 is to use a newly developed methodology which the applicant has chosen to call a "Master+Exception List." The master+exception list approach first chooses a commonly occurring byte to be the master. Then, in addition to remembering the master, compression 409 records any exceptions to this master byte which occur in the uncompressed file. The master+exception list approach is explained more fully below.

Choosing the master can be accomplished in a variety of ways. The preferred embodiment scans the first 2,048 bytes of the file to be compressed and tallies the occurrence of each different byte. Then, the most commonly occurring byte within the 2,048 bytes is assumed to be the most commonly occurring byte for the entire file to be compressed and is designated as the master byte. Further, a check is made to ensure that the selected master occurs with some degree of regularity (80% in the preferred embodiment of the present invention) within the first 2,048 bytes. The following is a copy of the C listing which handles the master determination:

```
// The purpose of this code is to find the Master.
// First, we gather the statistics for the representative part of the file by scanning
// the first 2048 bytes of the data to be compressed.
    for (i = 0; i <= 2048; i++) {
        c = getc(ptr);                    // ptr points to beginning of file.
        count[c]++;                       // incr. the counter for char "c".
    }
// Next, we want to find the char with the maximum count. That char is the
// potential master.
    max = 0;                              // assume count[0] contains the
                                          // maximum count.
    for (i = 1; i <= 255; i++) {          // compare against other chars.
        if (count[i] > count[max])
            max = i;
    }
    MASTER = max;                         // We just found the Master.
// We already find the char with the maximum count. Next, we want to insure that
// the char "max" is the real master.
    if (count[max] < THRESHOLD * 2048)    // THRESHOLD was set to 0.8.
        printf("Warning!! The master is under Threshold!!);
// Under the current implementation, no action is taken if the Master is under
// the Threshold.
```

Note that other possible approaches to determining which byte should be the master byte are equally valid.

Recording or listing the exceptions to the master during compression 409 can be accomplished in several ways. One way to record exceptions is by location and value (l,v) within the file being compressed. Location (l) refers to the number of bytes from the beginning of the uncompressed file to where the exception occurred, while value (v) refers to the character value of the particular exception. If there are sequential runs (r) of the same exception value (the same exception value occurs multiple times in a row), then another, and likely more efficient, way to record exceptions is by location, value and run (l,v,r) where run refers to how many times the exception is repeated in that particular sequence of the same exception value.

Referring again to the example cited vis-a-vis run length encoding supra, with a file 405 having an input sequence comprising (ZZZZYYYYZZZZZZXXXXZZZZ), the master+exception list compression approach 409 would result in a compressed file 413 comprising (M=Z,5Y,6Y,7Y,8Y,9Y,16X,17X,18X,19X) where Z is the master (denoted M in this example) and exceptions are noted by location (l) and value (v). And using the location, value, run (l,v,r) approach would yield a compressed file 413 comprising (M=Z, (5,Y,5),(16,X,4)).

Figure 5:
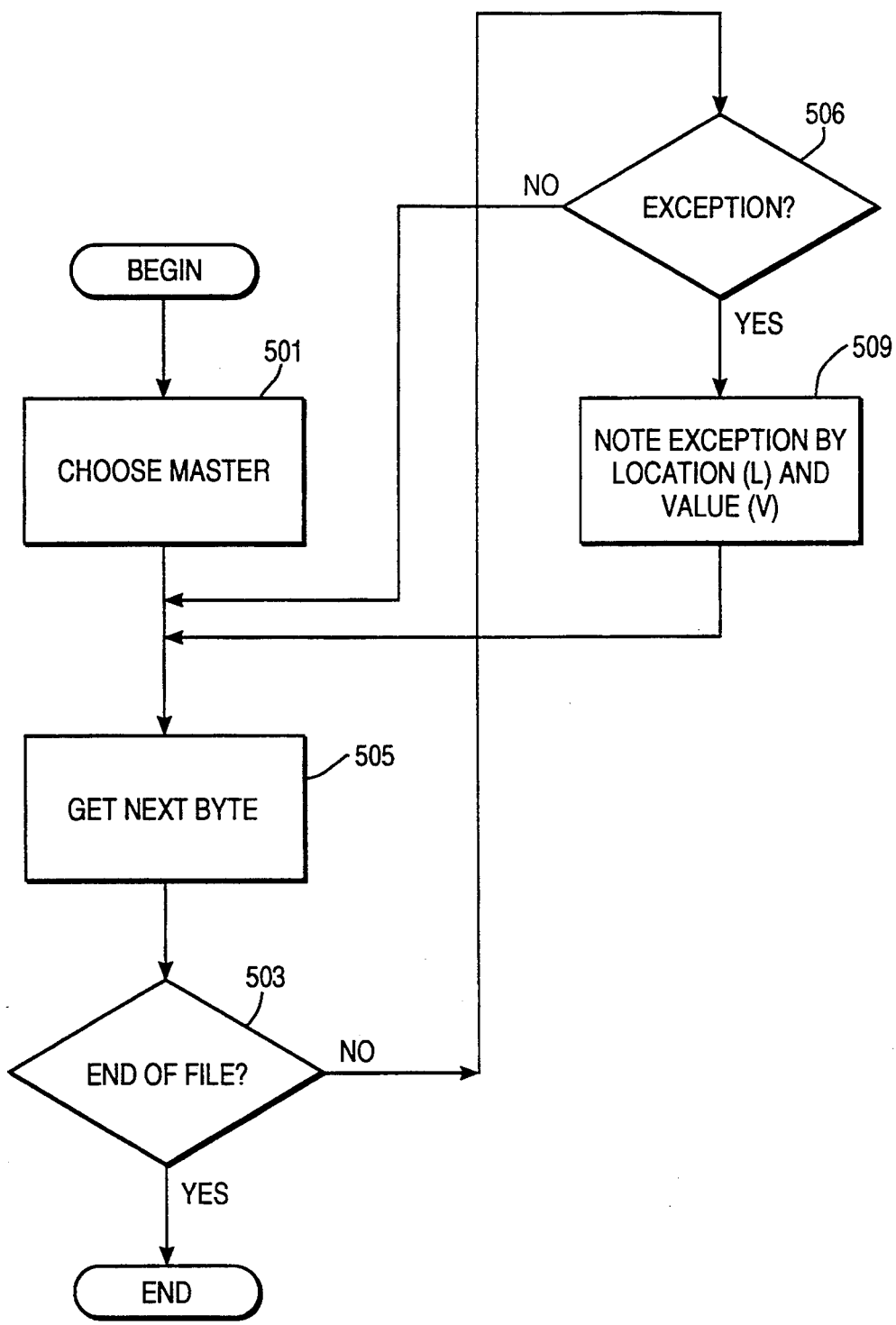
FIG. 5 is a flowchart of the master+exception list compression and decompression approach of the present invention.

This master+exception list compression approach 409 is explained more fully by reference to FIG. 5. The first step is to choose a master 501 from input file 405, as has been explained. Then the next byte (the first byte initially) is obtained 505 and a check is made to see whether the end of the data file has been reached 503. If the end of file has not been reached then a check is made to determine whether that byte is an exception 506 to the master byte. If the byte is not an exception (meaning it is the same as the master byte), then nothing more needs to be done with that byte. If the byte is an exception, then the exception byte is noted 509 by location (l) and value (v). In either case the next byte is then obtained 505, as was explained above, and the process continues until the end of file is reached.

This master+exception list approach should be particularly useful for text-based documents due to the inherently high degree of repetitiveness with such files. Further, the master+exception list approach is applicable to any document or file having a high degree of inherent redundancy (e.g., black and white images, faxes, etc). As such, the master+exception list approach could be used to compress any document or file, regardless of whether it is of the Unicode format or not.

Still another approach 409 to compressing the prefix group indicator bytes 405 is to use another new approach which the applicant has chosen to call an "improved run-length encoding" methodology. Referring again to the example cited vis-a-vis run-length encoding supra, note that occurrences of X, Y and Z were each treated equally. With improved run-length encoding a master byte is chosen as in the master+exception list approach, and the master byte is replaced by a 1 bit indicator. Then, the incoming uncompressed group indicator bytes 405 are replaced 409 by a combination of the master bits and the original value bytes in the compressed file 413. The improved run-length encoding approach is explained more fully below.

For example, again using the example cited vis-a-vis run length encoding supra with an input sequence 405 of (ZZZZYYYYYZZZZZZXXXXZZZZZ), the improved run-length encoding methodology would result in a compressed file 413 of (1111YYYYY111111XXXX11111) where the master byte Z has been replaced by the single master bit '1'. Further, if there are sequential runs of master bytes or original value bytes, these could be indicated by a run length value. Again using the example cited vis-a-vis run length encoding supra and a master of Z replaced by the single bit 1, an input sequence 405 of (ZZZZYYYYYZZZZZZXXXXZZZZZ) would result in a compressed file 413 of ((4,1),(5,Y),(6,1),(4,X),(5,1)) using the format ((count, character),(count, character)...). Note that while this might appear to be no more efficient than the first approach 409 (standard run-length encoding), remember that the improved run-length encoding approach has the advantage of replacing each 8-bit occurrence of the master character value 'Z' with the 1-bit master bit '1'.

Figure 8:
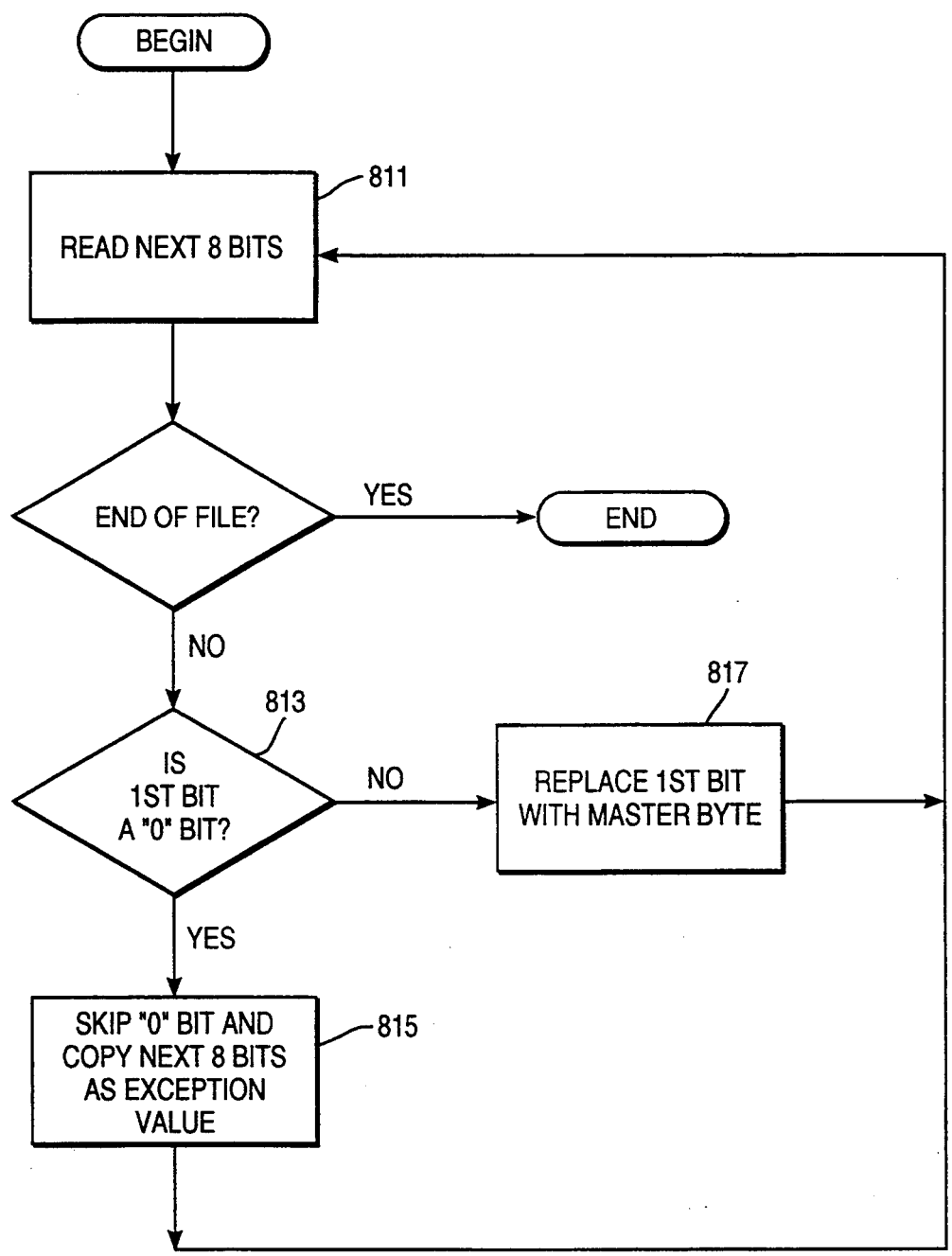
FIG. 8 is a flowchart of the decompression of a data file compressed with the improved run-length encoding compression and decompression approach of the present invention.

Note, however, that placing a single master bit in place of each occurrence of the master byte could cause misreading upon decompression of a file compressed using this improved run-length encoding approach. This misreading could occur as a result of reading the 1 bit master byte indicator in conjunction with the first 7 bits of the following byte. To avoid this sort of misread mistake from occurring, upon compression in the preferred embodiment of the present invention a single "0" bit is placed in front of the value field of each exception value character byte. Then, referring now to FIG. 8, when the file is decompressed and eight bits are read 811, if the first bit is a zero ("0") 813 then it is known that the eight bits which follow the zero bit should be read as an exception byte character value 815. Conversely, if the first bit is a one ("1") then it is known that it is an instance of the master bit 817 and, further, the following seven bits plus an additional bit should be read 811.

Figure 6:
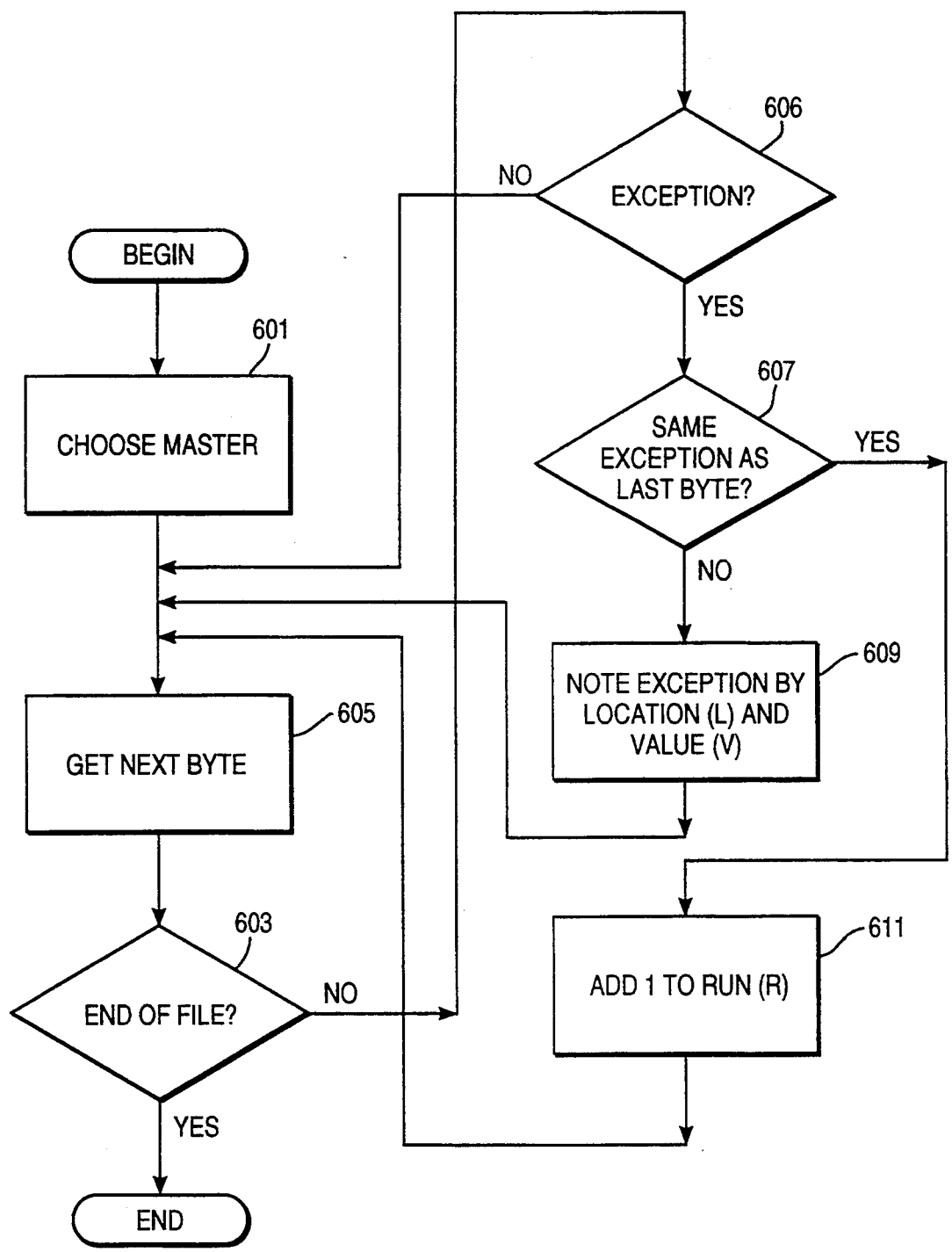
FIG. 6 is a flowchart of the improved run-length encoding compression and decompression approach of the present invention.
Figure 7:
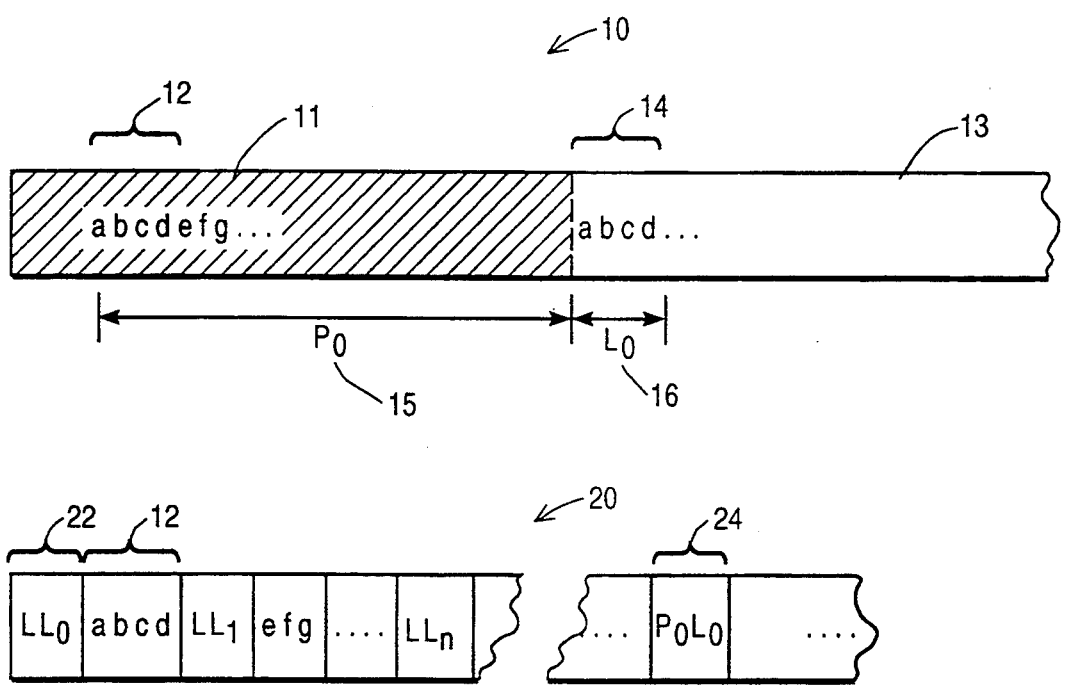
FIG. 7 depicts an example compression and decompression approach of the prior art.

This improved run-length encoding compression approach 409 is explained more fully by reference to FIG. 6. The first step is to choose a master 601 from input file 405 to be replaced by the 1-bit indicator. Then the next byte (the first byte initially) is obtained 605 and a check is made to see whether the end of the data file has been reached 603. If the end of file has not been reached then a check is made to determine whether that byte is an exception 606 to the master byte. If the byte is not an exception (meaning it is the same as the master byte), then the byte is replaced by the 1-bit master bit indicator. If the byte is an exception, then the exception byte is compared 607 to the last byte evaluated to determine whether there is a run of exception bytes. If the exception byte is not the same as the last byte considered then the exception is noted 609 by count (c) and character value (v) and a zero ("0") bit is placed in front of the exception character value byte. Conversely, if the exception byte is the same as the last byte then the exception is accounted for by incrementing 611 the run value (r). In either case the next byte is then obtained 605, as was explained above, and the process continues until the end of file is reached.

Note that all three compression approaches 409 described herein can be used by the same compression system. One compression methodology could be used on one prefix group indicator byte file while another compression methodology could be used on another prefix group indicator byte file. In this way, the most efficient compression methodology which is best suited to the particulars of each file can be used. In the preferred embodiment of the present invention all three compression approaches are applied to each data file to be compressed and then the results are compared. The approach which yielded the best compression ratio is then used.

In the foregoing specification, the invention has been described with reference to a specific exemplary embodiment and alternative embodiments thereof. It will, however, be evident that various modifications and changes may be made thereto without departing from the broader spirit and scope of the invention as set forth in the appended claims. The specifications and drawings are, accordingly, to be regarded in an illustrative rather than a restrictive sense.

What is claimed is:

1. A method for compressing a data file into a compressed data file, said method comprising:
    a) choosing one byte of the data file as a master byte;
    b) noting the master byte in the compressed data file; and,
    c) noting in the compressed data file each exception to the master byte which occurs in the data file by location (l) and value (v) of the exception in the data file.

2. The compression method of claim 1 wherein the step of choosing the master byte is accomplished by scanning a predetermined number of bytes of the data file and selecting the byte with the highest number of occurrences within the predetermined number of bytes of the data file.

3. The compression method of claim 2 wherein the predetermined number of bytes of the data file is 2048 bytes.

4. The compression method of claim 3 further comprising noting in the compressed data file sequences of repeated exception bytes within the data file by run (r) indicating the number of sequential repeated exception bytes in the data file.

5. A method for converting a data file to a compressed data file comprising:
    scanning a predetermined number of bytes of the data file, selecting the byte with the highest number of occurrences within the predetermined number of bytes of the data file as a master byte, and saving a master value (mv) of the master byte in the compressed data file;

scanning each byte of the data file and noting each exception to the master byte which occurs in the data file by saving in the compressed data file a location (l) and a value (v) within the data file of the exception to the master byte.

6. The compression method of claim 5 further comprising noting sequences of repeated bytes within the data file by incrementing a value of run (r) in the compressed data file indicating a number of sequential repeated bytes within the data file.

7. An apparatus for compressing a data file into a compressed data file, said apparatus comprising:
  a) processor means for choosing one byte of the data file as a master byte by scanning a predetermined number of bytes of the data file, selecting the byte with the highest number of occurrences within the predetermined number of bytes of the data file, and saving a master value (mv) of the master byte in the compressed data file;
  b) processor means for noting each exception to the master byte in the data file by location (l) within the data file and by value (v) of the exception;
  c) memory means for storing the compressed data file.

* * * * *